US006941121B2

(12) United States Patent
Chen (10) Patent No.: US 6,941,121 B2
(45) Date of Patent: Sep. 6, 2005

(54) METHOD FOR CALIBRATING A DC OFFSET CANCELLATION LEVEL FOR DIRECT CONVERSION RECEIVERS

(75) Inventor: Jesse E. Chen, Sunnyvale, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 452 days.

(21) Appl. No.: 10/151,597

(22) Filed: May 16, 2002

(65) Prior Publication Data

US 2002/0197975 A1 Dec. 26, 2002

Related U.S. Application Data

(60) Provisional application No. 60/292,099, filed on May 18, 2001.

(51) Int. Cl.[7] .............................. H04B 1/06; H04B 7/00
(52) U.S. Cl. ............................... 455/232.1; 455/246.1; 455/251.1; 375/345
(58) Field of Search .......................... 455/232.1, 234.1, 455/240.1, 241.1, 242.2, 244.1, 245.2, 250.1, 251.1, 226.1, 234.2, 246.1; 375/317, 319, 345

(56) References Cited

U.S. PATENT DOCUMENTS

| 4,612,585 | A | | 9/1986 | Takase et al. | |
|---|---|---|---|---|---|
| 4,766,497 | A | | 8/1988 | Banach et al. | |
| 5,745,838 | A | | 4/1998 | Tresness et al. | |
| 6,031,432 | A | | 2/2000 | Schreuders | |
| 6,321,073 | B1 | * | 11/2001 | Luz et al. | 455/239.1 |
| 6,442,380 | B1 | * | 8/2002 | Mohindra | 455/234.1 |
| 6,498,929 | B1 | * | 12/2002 | Tsurumi et al. | 455/296 |
| 6,654,593 | B1 | * | 11/2003 | Simmons et al. | 455/234.1 |
| 6,711,393 | B1 | * | 3/2004 | Stenstrom et al. | 455/284 |
| 6,735,422 | B1 | * | 5/2004 | Baldwin et al. | 455/232.1 |
| 6,771,945 | B1 | * | 8/2004 | Pickett et al. | 455/324 |
| 2003/0207674 | A1 | * | 11/2003 | Hughes | 455/234.1 |

FOREIGN PATENT DOCUMENTS

EP          0594894 A1  * 10/1992   ........... H04L/27/22

OTHER PUBLICATIONS

Liu T. and Westerwick, E., "5–GHz CMOS Radio Transceiver Front–End Chipset", *IEEE Journal of Solid–State Circuits*, vol. 35, No. 12, Dec. 2000, pp. 1927–1941.

Steyaert et al., "A 2–V CMOS Cellular Transceiver Front–End", *IEEE Journal of Solid–State Circuits*, vol. 35, No. 12, Dec. 2000, pp. 1895–1907.

(Continued)

*Primary Examiner*—Simon Nguyen
(74) *Attorney, Agent, or Firm*—Withrow & Terranova, PLLC (57) ABSTRACT

A method for measuring a difference in DC offsets associated with different gain settings in a direct conversion receiver having a variable gain is provided. In a first phase, a set of response parameters that characterize a time-dependent system response to a known change in the DC offset is determined. Each response parameter corresponds to the response measured at a different time after the change. In a second phase, different gain settings are applied to the system and the response is measured at times corresponding to the times associated with each of the response parameters. The response parameters are then used to determine the difference in DC offsets associated with the different gain settings.

26 Claims, 8 Drawing Sheets

OTHER PUBLICATIONS

Lam, C. and Razavi, B., "A 2.6–GHz/5.2–GHz Frequency Synthesizer in 0.4–µm CMOS Technology", *IEEE Journal of Solid–State Circuits*, vol. 35, No. 5, May 2000, pp. 788–794.

Rategh et al., "A CMOS Frequency Synthesizer with an Injection–Locked Frequency Divider for a 5–GHz Wireless LAN Receiver", *IEEE Journal of Solid–State Circuits*, vol. 35, No. 5, May 2000, pp. 780–787.

Samavati et al., "A 5–GHz CMOS Wireless LAN Receiver Front End", *IEEE Journal of Solid–State Circuits*, vol. 35, No. 5, May 2000, pp. 765–772.

Razavi, B., *RF Microelectronics*, Prentice Hall PTR, 1997, pp. 129–133.

Namgoong, W. and Meng, T., "Direct–Conversion RF Receiver Design," IEEE Transactions on Communications, vol. 49, No. 3, Mar. 2001, pp. 518–529.

Haspeslagh D. et al., "BBTRX: A Baseband Transceiver for a Zero IF GSM Hand Portable Station," IEEE Custom Integrated Circuits Conference, Boston, MA, 1992, pp. 10.7.1–10.7.4.

* cited by examiner

METHOD FOR CALIBRATING A DC OFFSET CANCELLATION LEVEL FOR DIRECT CONVERSION RECEIVERS

CROSS-REFERENCES TO RELATED APPLICATIONS

This application claims the benefit of U.S. Provisional Application No. 60/292,099, filed May 18, 2001, entitled "Algorithm for Calibrating a DC Offset Cancellation Table for Zero IF Receivers," which disclosure is incorporated herein by reference.

BACKGROUND OF THE INVENTION

The present invention relates in general to a direct-conversion, or zero-intermediate-frequency, receiver, and in particular to measuring and canceling DC offsets in a direct-conversion receiver.

Radio-frequency (RF) signals generally consist of a carrier wave having a carrier frequency modulated by a data signal having a signal frequency distribution. RF receivers are designed to receive the RF signal and extract the data signal for further processing. In standard heterodyne receivers, the data signal is extracted by mixing the received signal with the output of a first local oscillator operating at a frequency less than the carrier frequency, thereby generating an intermediate-frequency (IF) signal. The IF signal is then filtered and amplified before being converted to the baseband. Conversion to the baseband generally involves mixing the IF signal with the output of a second local oscillator operating at the intermediate frequency.

Recently, there has been increased interest in direct-conversion, or zero-IF, receivers as an alternative to heterodyne architectures. In zero-IF receivers, there is one local oscillator operating at the carrier frequency, and the received signal is converted directly to the baseband without IF signal processing. Such receivers typically require simpler analog components than heterodyne receivers (e.g., analog filters and amplifiers for zero-IF receivers operate in the baseband rather than at a nonzero intermediate frequency) and consume less power. Because zero-IF receivers can operate at lower power and be more easily integrated into monolithic systems than heterodyne receivers, zero-IF receivers are recognized as potentially very useful for applications where low cost, low power consumption, and small size are important, such as various wireless mobile handheld devices.

Zero-IF receivers, however, are susceptible to noise from sources that are either far less significant or entirely absent in heterodyne receivers. One important noise source in zero-IF receivers is DC offset, a nonzero voltage that appears at the mixer output in the absence of a data signal. DC offset is caused, for instance, by current leakage from the local oscillator (which operates at the carrier frequency) to the mixer or other RF components, e.g., an RF amplifier. This leakage current can be propagated into the mixer, leading to a DC offset in the baseband signal. After a subsequent analog amplification stage, the DC offset can saturate downstream components, such as analog-to-digital converters, resulting in an increased receiver error rate. Thus, zero-IF receivers generally require DC offset cancellation.

One solution is to provide a current (or voltage) source downstream of the mixer and upstream of other (baseband) analog components. The current source is configured to provide a current (or DC voltage) that cancels the DC offset. In cases where the receiver has variable gain, the current source may be adjustable (e.g., voltage controlled), with the voltage determined by a lookup table responsive to the gain setting. Such lookup tables must be properly calibrated. Ideally, the calibration is updated from time to time, as conditions affecting the DC offset may change over time.

Another solution, which may be used in conjunction with a current or voltage source, is to provide AC coupling between the RF and baseband analog components, e.g., by placing a capacitor in the signal path between the mixer and the baseband components. The capacitor filters out constant DC offsets. In the case of a receiver having variable gain, however, an abrupt change in the gain may cause an abrupt change in the DC offset that is not immediately filtered by the capacitor. Thus, in the case of a variable gain receiver with AC coupling, it is generally useful to provide a current source to cancel the DC offset, as described above. In AC-coupled systems, however, calibration of the lookup table is difficult because a change in DC offset generally causes a time-dependent response in the baseband components that is not readily converted into a measurement of the DC offset.

A calibration method that is effective in the presence of a time-varying system response to an abrupt change in an input is therefore desirable.

BRIEF SUMMARY OF THE INVENTION

The present invention provides a method for calibrating a DC offset associated with a gain setting in a direct conversion (zero-IF) receiver having a variable gain. In general, the method involves measuring system response parameters that characterize a time-dependent system response to a known change in the DC offset, with each response parameter being associated with the response to the known change as measured at a different time. Different gain settings are then applied to the system, and the response is measured at the times associated with each of the response parameters. The response parameters are then used to determine the size of the DC offset shift associated with each gain setting. The DC offset shifts may then be used to determine a voltage that will cancel the DC offset.

According to one aspect of the invention, in a receiver having a plurality of gain settings including at least a first gain setting and a second gain setting, a method is provided for determining a difference between a first DC offset associated with the first gain setting and a second DC offset associated with the second gain setting. During a first phase, values of a plurality of system response parameters are determined. The system response parameters characterize a time-dependent system response to a unit step change in the DC offset, each system response parameter being associated with a different elapsed time. During a second phase, a plurality of first measurements are made of a system output in response to a change in the gain setting from the first gain setting to the second gain setting. The first measurements are made at times corresponding to the elapsed times associated with the system response parameters. The difference between the first DC offset and the second DC offset is computed using the values of the plurality of system response parameters and the plurality of first measurements. The method may be used to determine differences between a reference DC offset associated with the reference gain setting and any number of other (non-reference) DC offsets associated with non-reference gain settings of the receiver. Values representing the differences may be stored in a lookup table in association with the respective gain setting and used to generate a control signal for causing a DC level generator to provide a DC offset cancellation voltage.

According to another aspect of the invention, in a direct conversion receiver having a reference gain setting associated with a reference DC offset, a plurality of non-reference gain settings, each of the non-reference gain settings being associated with a respective non-reference DC offset, and a controllable DC level generator, a method is provided for measuring differences between the reference DC offset and each of the non-reference DC offsets. The controllable DC level generator is set to a standby setting, thereby applying a standby DC offset. While maintaining the gain setting at the reference gain setting, the controllable DC level generator is operated to change, at regular time intervals, a known DC offset applied to the receiver, wherein each regular time interval has a duration substantially equal to a step time T. Beginning at a fixed time after each act of changing the known DC offset, an average system output is measured over a measurement interval having a duration substantially equal to a measurement time τ, thereby obtaining a plurality of first measurements. Values of the plurality of system response parameters are computed from the plurality of first measurements. The controllable DC level generator is reset to the standby setting, thereby reapplying the standby DC offset. While maintaining the controllable DC level generator at the standby setting, the gain setting of the receiver is changed, at regular time intervals, to a different one of the non-reference gains, wherein each regular time interval has a duration substantially equal to the step time T. Beginning at the fixed time after each act of changing the gain setting (i.e., the same fixed time interval that was used in making the first measurements), an average system output is measured over a measurement interval having a duration substantially equal to the measurement time τ, thereby obtaining a plurality of second measurements. Differences between the reference DC offset and each of the non-reference DC offsets are then computed using the plurality of second measurements and the values of the plurality of system response parameters.

The following detailed description together with the accompanying drawings will provide a better understanding of the nature and advantages of the present invention.

DETAILED DESCRIPTION OF THE INVENTION

The present invention provides a method for calibrating a DC offset associated with a gain setting in a direct conversion (zero-IF) receiver having a variable gain. In one embodiment, the invention provides a method that involves measuring system response parameters that characterize a time-dependent system response to a known change in the DC offset, with each response parameter being associated with the response to the known change as measured at a different time. Different gain settings are then applied to the system, and the response is measured at the times associated with each of the response parameters. The response parameters are then used to determine the size of the DC offset shift associated with each gain setting. The calibration method may be performed automatically and periodically in an AC-coupled receiver or in other applications in which a constant DC offset is to be determined from a time-dependent system response.

Figure 1:
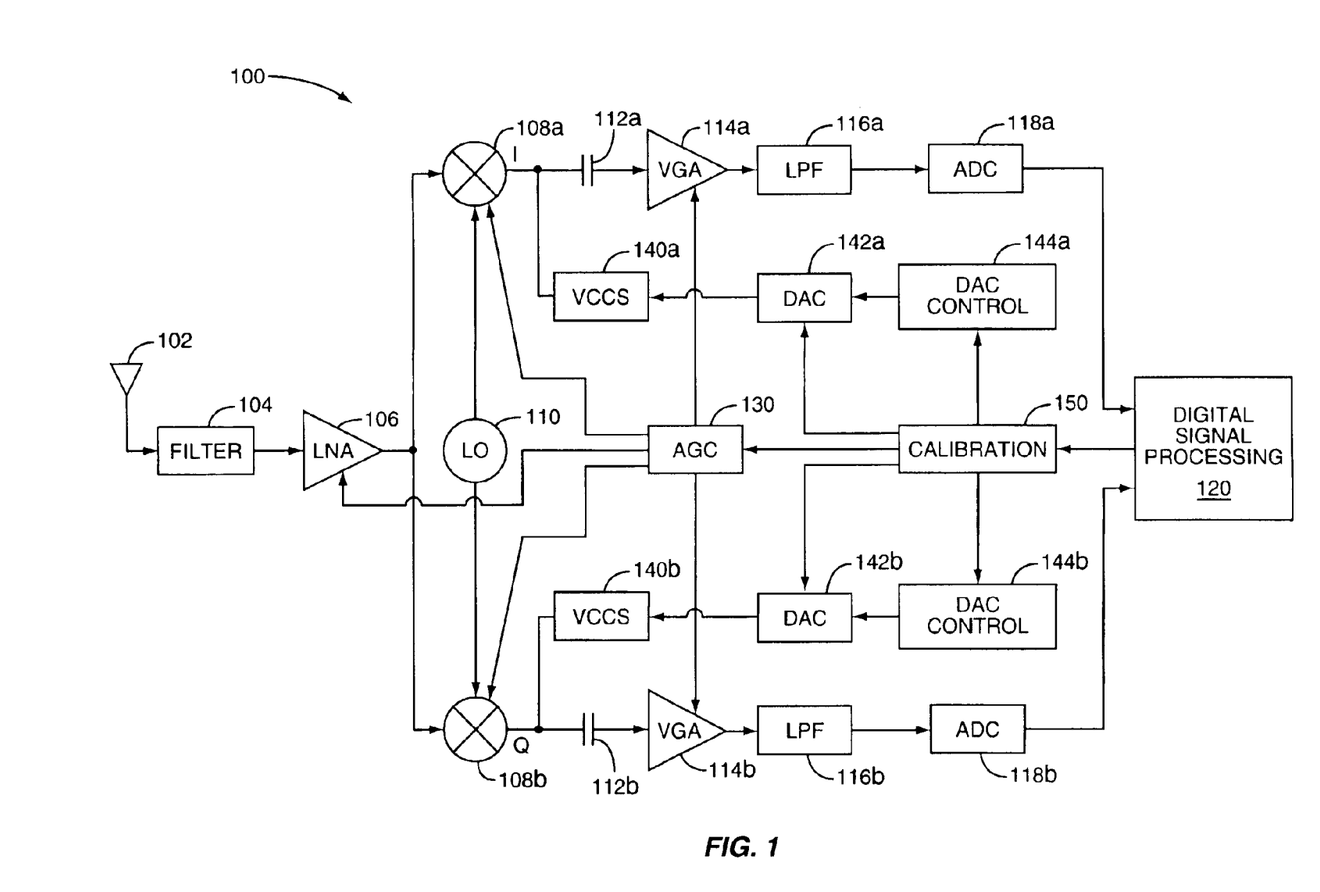
FIG. 1 is a simplified block diagram of a direct conversion (zero-IF) receiver having components for performing calibration according to the present invention.

FIG. 1 shows an exemplary zero-IF (direct conversion) receiver 100 having components for performing calibration according to the present invention. Receiver 100, which may be implemented using standard components, includes an antenna 102 for receiving an RF signal. Filter 104 and low-noise amplifier (LNA) 106 prepare the received signal for mixing by mixers 108a, 108b. Each of mixers 108a and 108b receives an oscillatory signal at the carrier frequency from a local oscillator (LO) 110. Mixers 108a and 108b mix the received signal with the local oscillator signal to produce in-phase (I) and quadrature (Q) baseband signals, respectively. DC blocking capacitors 112a, 112b are provided on the in-phase and quadrature legs, respectively, to isolate the RF and baseband biasing circuits. During steady-state operation, DC blocking capacitors 112a, 112b also prevent a constant DC offset in the RF components from propagating to the baseband circuitry. The baseband analog components include a pair of variable gain amplifiers (VGA) 114a, 114b, a pair of low-pass filters (LPF) 116a, 116b, and a pair of analog-to-digital converters (ADC) 118a, 118b. Digital signals from ADCs 118a, 118b are provided to digital signal processing components 120 for reconstruction of the transmitted data signal.

Receiver 100 has a variable gain controlled by an automatic gain control (AGC) unit 130. AGC unit 130 sets gain levels for low noise amplifier 106, mixers 108a, 108b, and variable gain amplifiers 114a, 114b. AGC unit 130 generally has a pre-established number of gain settings, each of which identifies a combination of low noise amplifier, mixer, and variable gain amplifier settings; during receiver operation, one of these gain settings is selected in response to control signals received from digital signal processing components 120.

During operation, when AGC unit 130 adjusts the gain of low noise amplifier 106 and/or mixers 108a, 108b, an abrupt change in DC offset typically occurs. This change generally is not blocked by capacitors 112a, 112b. Thus, on the in-phase and quadrature legs of receiver 100, further DC offset cancellation is provided by voltage-controlled current source units (VCCS) 140a, 140b, respectively coupled to the outputs of mixers 108a, 108b. Control signals for VCCS units 140a, 140b are supplied by digital-to-analog converters (DAC) 142a, 142b, respectively. During receiver operation, DAC control units 144a, 144b receive the gain setting from AGC unit 130 and determine corresponding settings for respective DACs 142a, 142b, using, e.g., lookup tables stored in DAC control units 144a, 144b. DAC control units 144a, 144b then set respective DACs 142a, 142b to the correct settings, thereby causing VCCS units 140a, 140b to generate appropriate currents (or voltages) to cancel the change in DC offset on each leg. In an alternative embodiment, controllable voltage sources are used for DC offset cancellation in place of VCCS units 140a, 140b.

In order for the DAC control units 144a, 144b to select effective DAC settings, the lookup tables in DAC control units 144a, 144b are calibrated from time to time. Calibration unit 150 performs the calibration function. During calibration, calibration unit 150 controls operation of DACs 142a, 142b, and AGC unit 130, and receives measurement data from digital signal processing components 120. Calibration unit 150 determines a lookup table value associated with each available gain setting based on the measurement data and provides the computed values to the lookup tables of DAC control units 144a, 144b. The operation of calibration unit 150 will be further described below. It is to be understood that the in-phase and quadrature legs of receiver 100 may have different responses to a particular gain setting, and that the calibration of the lookup tables for DAC control units 144a and 144b may proceed independently.

It will be appreciated that in receiver 100, a change in DC offset leads to a time-dependent system response in the baseband analog components downstream of capacitors 112a, 112b, generally in the shape of a voltage step followed by a gradual decrease back to the steady state as capacitors 112a, 112b respond to the changed DC offset. A calibration algorithm according to the present invention uses this time-dependent system response to extract a change in DC offset associated with each gain setting.

Figure 2:
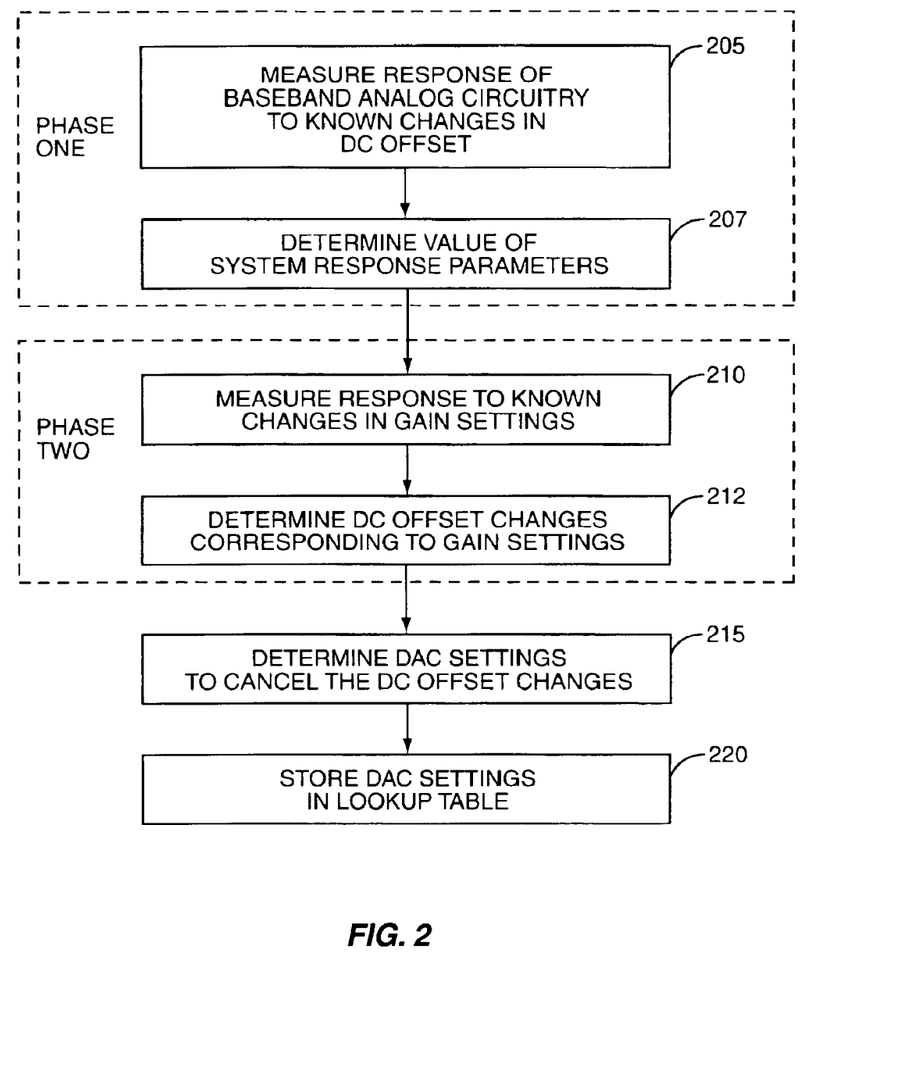
FIG. 2 is a flow diagram of a calibration process according to an embodiment of the present invention.

FIG. 2 is a flow chart showing an overview of a calibration algorithm 200 according to one embodiment of the present invention that may be performed by calibration unit 150. According to this embodiment, the in-phase and quadrature legs of receiver 100 are considered separately for purposes of calibration, except that both legs may share the timing described below. In Phase One, the response of the baseband analog circuitry to a sequence of known changes in the DC offset is measured (step 205). As will be described further below, known changes in the DC offset may be provided by shifting the setting of DAC 142a through a predetermined sequence of known values while holding the gain setting of AGC unit 130 constant. Based on these measurements, values for a set of parameters that characterize the time-dependent system response to a unit change in DC offset are determined (step 207). In Phase Two, the system response to a sequence of known changes in the gain setting is measured (step 210). As will be described further below, step 210 generally involves setting DAC 142a to a standby value (e.g., zero) and shifting the AGC unit 130 through a predetermined sequence of gain settings. The system response parameters determined at step 207 and the measurements of step 210 are then used to determine the changes in DC offset associated with the different gain settings (step 212). At step 215, the DC offset changes determined in Phase Two are used to identify a DAC setting for each gain value that will cause VCCS 140a to produce a current (or voltage) that will cancel the shift in DC offset. These DAC settings are stored in the lookup table in DAC control unit 144a at step 220. Calibration of the quadrature leg proceeds similarly and may be executed in parallel with calibration of the in-phase leg; it is to be understood that the system response parameters and DAC settings for the quadrature leg may be independent of those used for the in-phase leg.

The calibration algorithm according to the present invention measures changes in DC offset by using a set of parameters that characterize the time-dependent system response. In one embodiment, AGC unit 130 has four combinations of LNA and mixer gain settings, and the system response to a unit change in DC offset occurring at a time t=0 is characterized by three parameters a, b, and c. More specifically, u(t) is defined to be the unit step function:

$$u(t) = \begin{cases} 0, t < 0 \\ 1, t \geq 0, \end{cases} \quad (1)$$

and h(t) is defined to be the time-dependent system response (i.e., an output voltage of the baseband analog circuitry) when the DC offset as a function of time is described by u(t). The system response parameters a, b, and c are defined as:

$$a = \int_{T-\tau}^{T} h(t)dt; \quad (2)$$

$$b = \int_{2T-\tau}^{2T} h(t)dt; \quad (3)$$

$$c = \int_{3T-\tau}^{3T} h(t)dt; \quad (4)$$

Figure 4A:
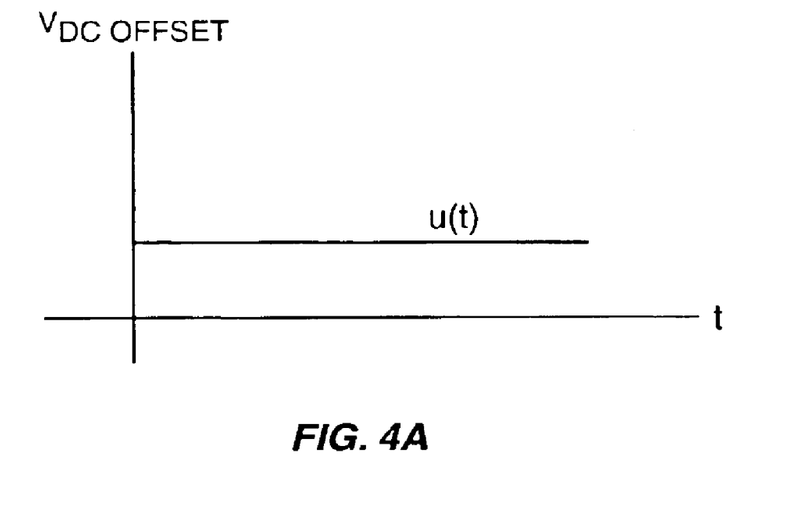
FIGS. 4A–B are graphs illustrating a definition of system response parameters according to an embodiment of the present invention.
Figure 4B:
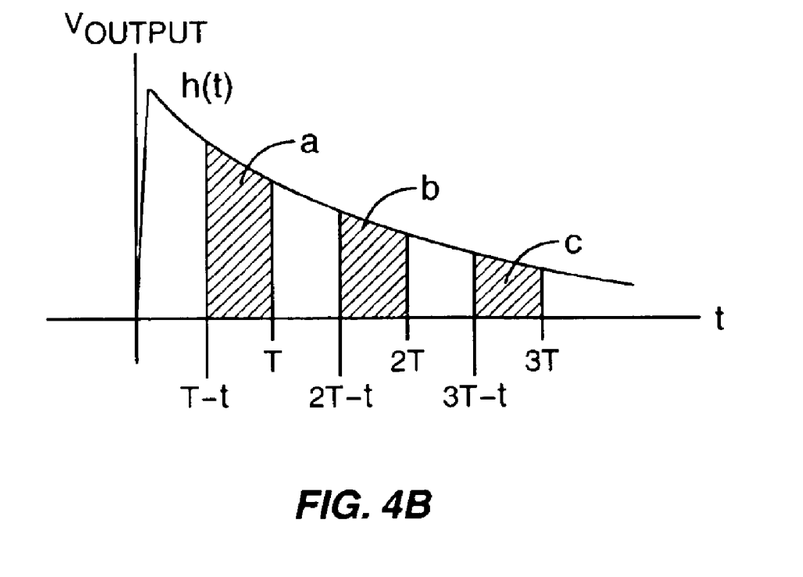

That is, parameter a represents the time average of the system response h(t) over a time interval of duration τ, beginning at a time T−τ and ending at a time T. Parameters b, and c represent time averages of the system response h(t) over intervals of duration τ, beginning at the times 2T−τ, and at 3T−τ, respectively. The definition of parameters a, b, and c is illustrated by the graphs in FIGS. 4A–B. FIG. 4A shows the unit step change in DC offset occurring at time t=0. FIG. 4B shows the system response h(t). The shaded areas represent parameters a, b, and c.

Figure 3:
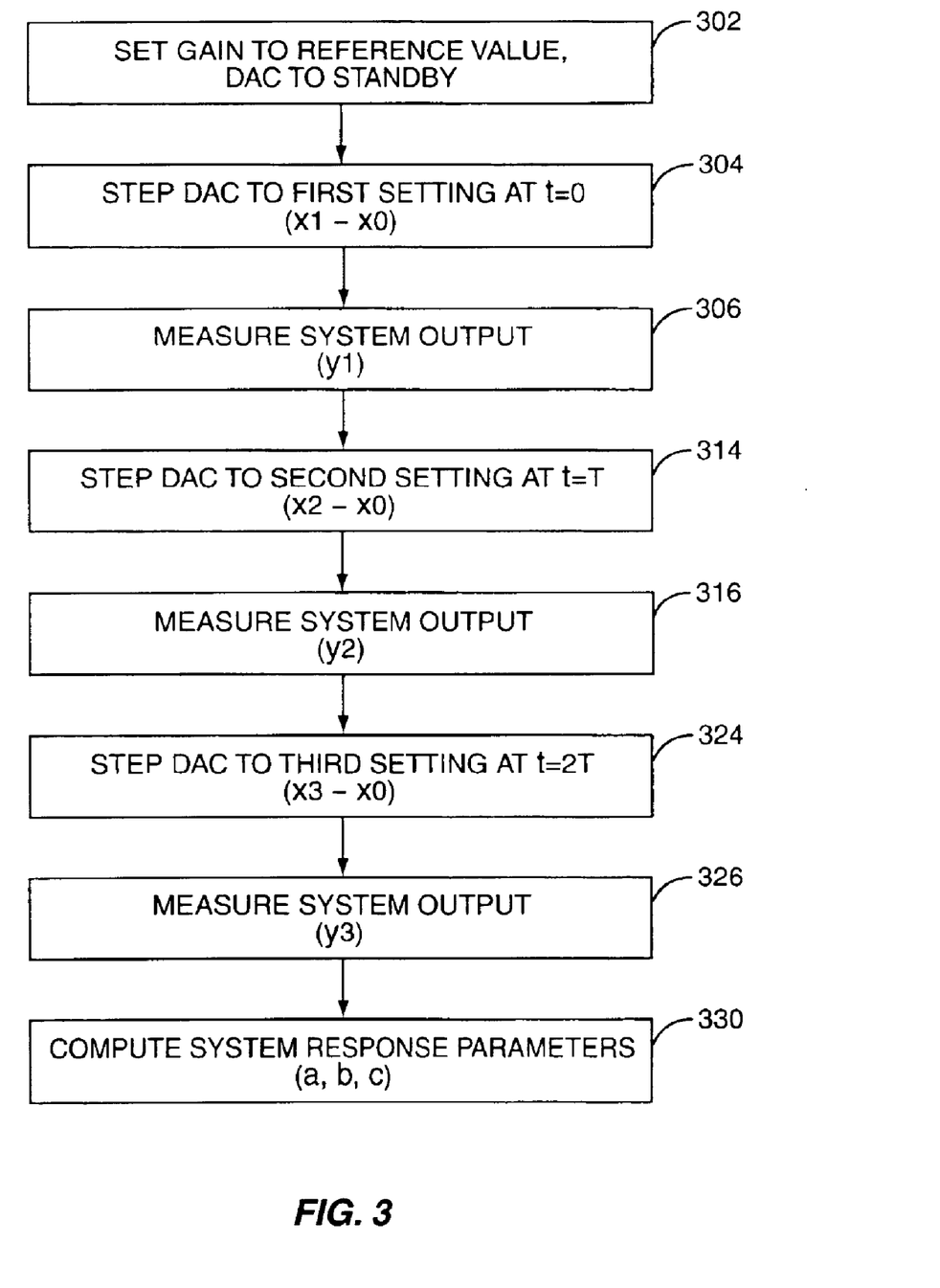
FIG. 3 is a flow diagram of a first phase of a calibration process according to an embodiment of the present invention.
Figure 5A:
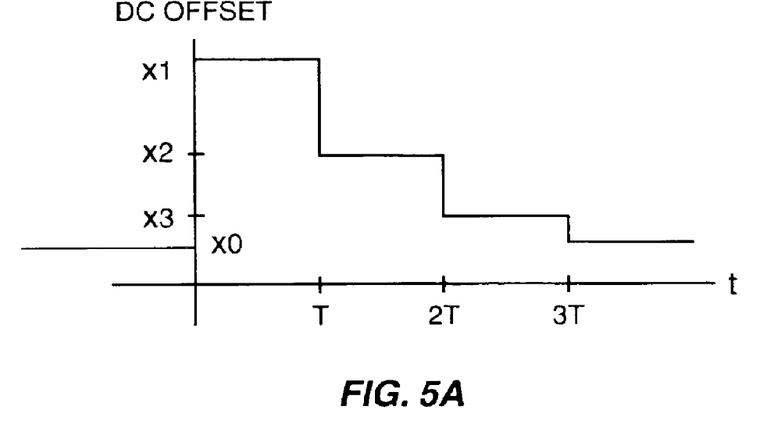
FIGS. 5A–B are graphs illustrating, respectively, changes in DC offset and the resulting output voltage during a first phase of a calibration process according to an embodiment of the present invention.
Figure 5B:
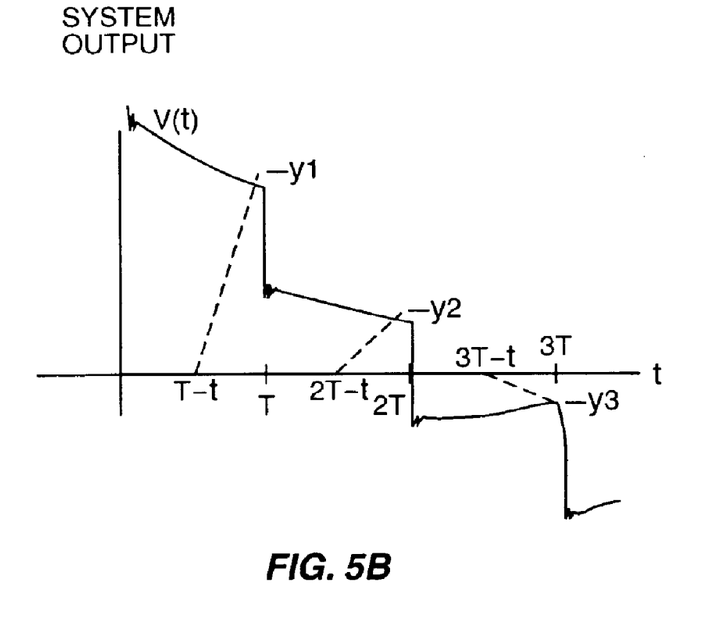

FIG. 3 illustrates a sequence of calibration steps for Phase One, in which the values of parameters a, b, and c are determined, in more detail. In Phase One, a known stepwise change to the DC offset is made at each of times 0, T, and 2T, as illustrated in FIG. 5A. The system response (i.e., the output voltage of the baseband analog circuitry, shown as V(t) in FIG. 5B, is sampled at three-second time intervals beginning at T−τ, 2T−τ, and 3T−τ, respectively. The values of the system response parameters a, b, and c are extracted from the measurements. While the following description refers only to the in-phase leg of receiver 100, it is to be understood that the same calibration procedure using the same timing may be applied to the quadrature leg.

More specifically, at step 302, calibration unit 150 causes AGC unit 130 to set the gain to a reference setting that is not changed during Phase One. At approximately the same time, calibration unit sets DAC 142a to a standby setting, which may be zero or another value. (It should be noted that a different standby setting may be chosen for DAC 142b in the quadrature leg.) In this standby state, there is a DC offset having an unknown value x0, as shown in FIG. 5A. Receiver 100 is maintained in the standby state for a sufficient time (e.g., 50 μs in one embodiment) so that the DC offset x0 is blocked by capacitor 112a.

At step 304, calibration unit 150 sets DAC 142a to a first known value, causing VCCS 140a to generate a DC current (or voltage). This added DC current changes the DC offset from x0 to x1, where the difference x1−x0 is known. FIG.

5A illustrates the change in DC offset occurring at the reference time t=0. The system responds with a step in the output voltage V(t) followed by a gradual decrease, as shown in FIG. 5B. The response may also include some fast fluctuations (transient ringing) that quickly damp out. At step 306, a first time average of the output voltage (y1) is measured for a time interval beginning at time T–τ and ending at time T. In an exemplary embodiment, T=4 μs and τ=2 μs, although other values may be chosen. FIG. 5B shows the measurement of time-averaged output voltage y1 for one embodiment. In this embodiment, the time average y1 is measured by accumulating normalized samples over the sampling interval of duration τ at a fixed sampling rate (e.g., 20 MHz), with each sample being normalized so that the final accumulated value of y1 represents the average value of V(t) over the measurement interval. In this embodiment, the measurement interval is chosen to begin after the transient ringing has damped out.

At time T, just after the measurement of y1 is completed, calibration unit 150 sets DAC 142a to a second known value (step 314). As illustrated in FIG. 5A, changing the DAC setting causes the DC offset to change from x1 to x2, where x2–x0 is known. A second step in the output voltage V(t) followed by a gradual decrease, as shown in FIG. 5B, results. At step 316, a second time average of the system response (y2) is measured over a time interval beginning at time 2T–τ and ending at time 2T, in a manner similar to the measurement of y1 at step 306. The resulting measurement of y2 is shown in FIG. 5B. It should be noted that the duration of the measurement interval τ as well as the time elapsed between the shift in DAC settings and the beginning time of the measurement interval match the corresponding values from step 306 as nearly as practicable. It should also be noted that the time T between shifts in the DAC settings is generally not long enough for the receiver to settle to the steady state. For instance, T may be 4 μs while the settling time of the receiver is 50 μs.

At time 2T, just after the measurement of y2 is completed, calibration unit 150 sets DAC 142a to a third known value (step 324). As illustrated in FIG. 5A, changing the DAC setting causes the DC offset to change from x2 to x3, where x3–x0 is known. A third step in the output voltage V(t) followed by a gradual decrease, as shown in FIG. 5B, results. At step 326, a third time average of the system response (y3) is measured over a time interval beginning at time 3T–τ and ending at time 3T, in a manner similar to the measurement of y1 at step 306. The resulting measurement of y3 is shown in FIG. 5B. It should be noted that the duration of the measurement interval τ as well as the time elapsed between the shift in DAC settings and the beginning time of the measurement interval match the corresponding values from steps 306 and 316 as nearly as practicable.

At step 330, values of the system response parameters a, b, and c (as defined above) are determined. More specifically, the DC offset as a function of time (shown in FIG. 5A) may be represented by:

$$DC(t)=(x1-x0)*u(t)+(x2-x1)*u(t-T)+(x3-x2)*u(t-2T). \quad (5)$$

As described above, y1, y2, and y3 are measured system responses to DC(t) over the time intervals (T–τ, T), (2T–τ, 2T), and (3T–τ, 3T), respectively. From the definitions of the system response parameters a, b, and c given in Equations (2)–(4), it follows that:

$$y1=(x1-x0)*a; \quad (6)$$

$$y2=(x1-x0)*b+(x2-x1)*a; \text{and} \quad (7)$$

$$y3=(x1-x0)*c+(x2-x1)*b+(x3-x2)*a. \quad (8)$$

As described above, the shifts in DC offset (i.e., x1–x0, x2–x0, and x3–x0) are known. Thus, at step 330, the system response parameters a, b, and c are determined by solving Equations (6)–(8), thereby obtaining:

$$a = \frac{y1}{(x1-x0)}; \quad (9)$$

$$b = \frac{[y2-a(x2-x1)]}{(x1-x0)}; \text{and} \quad (10)$$

$$c = \frac{[y3-a(x3-x2)-b(x2-x1)]}{(x1-x0)}. \quad (11)$$

Figure 6:
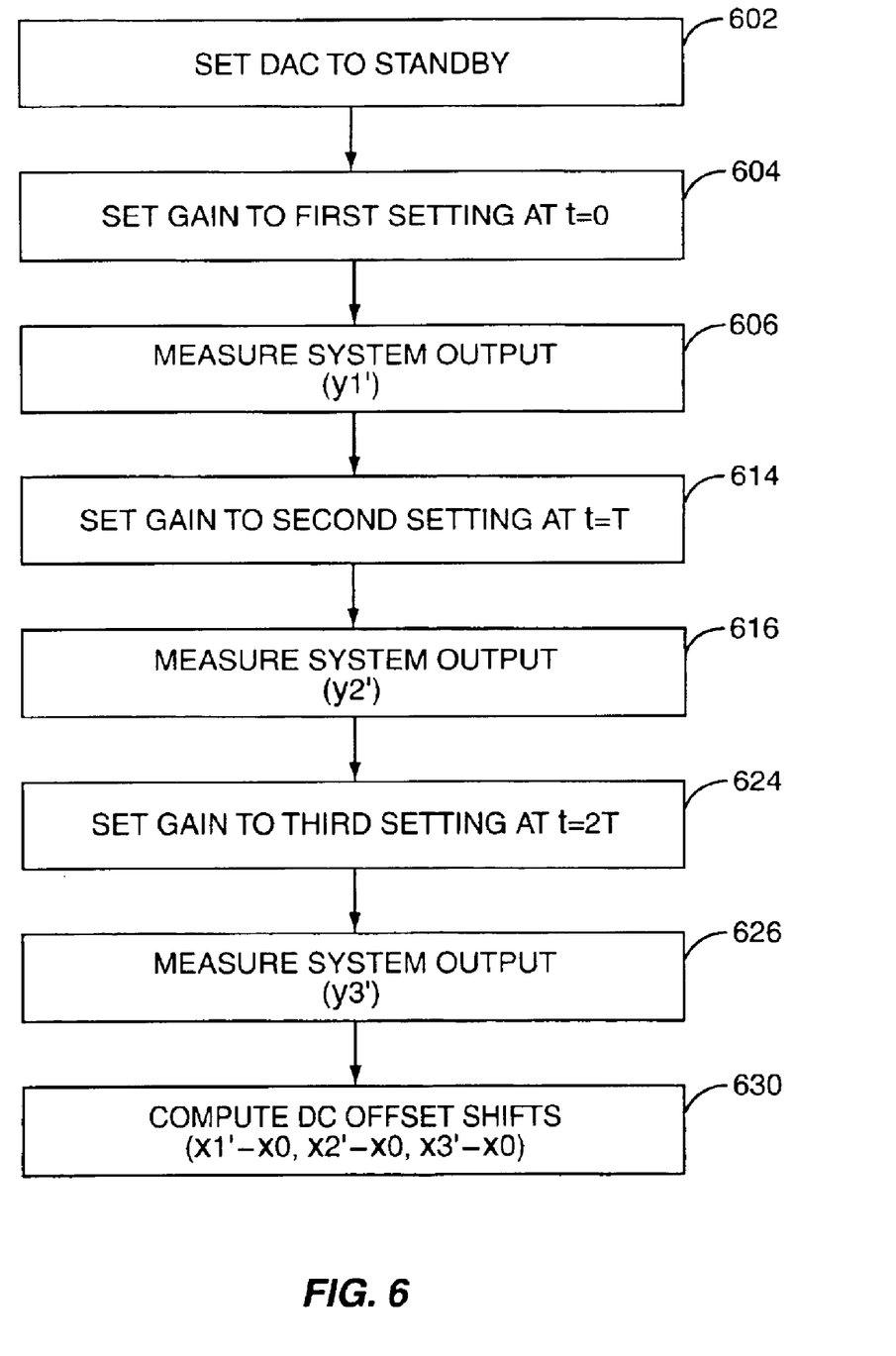
FIG. 6 is a flow diagram of a second phase of a calibration process according to an embodiment of the present invention.
Figure 7A:
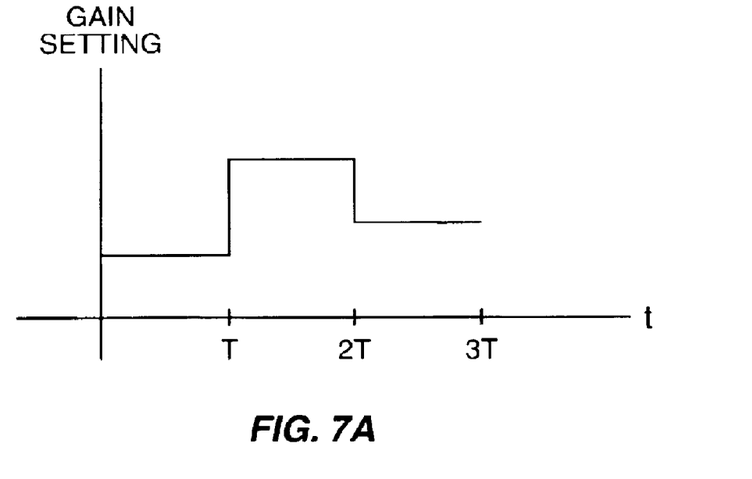
FIGS. 7A–B are graphs illustrating, respectively, changes in DC offset and the resulting output voltage during a second phase of a calibration process according to an embodiment of the present invention.
Figure 7B:
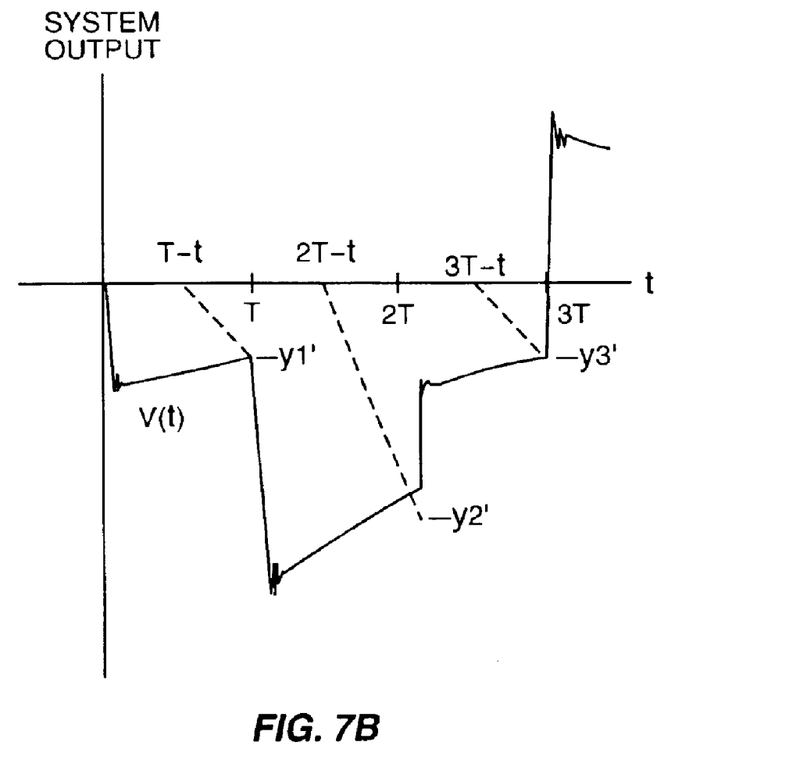

After the system response parameters a, b, and c have been determined, calibration process 200 proceeds to Phase Two, which is illustrated in detail in FIG. 6. In general, Phase Two involves sampling the system response to a sequence of stepwise changes in the gain setting, as illustrated in FIGS. 7A–B, with the DAC set to the same standby setting that was used in Phase One. The system response parameters a, b, and c determined in Phase One are then used to determine the DC offset changes corresponding to the gain settings.

More specifically, at step 602, while the gain remains at the reference setting used in Phase One, DAC 142a is set to the same standby setting used in step 302 (e.g., a value of zero) so that only the unknown (and irrelevant) DC offset x0 is present. DAC 142a is maintained at this standby setting throughout Phase Two. A sufficient settling time (about 50 μs in an exemplary embodiment) is allowed to elapse so that the DC offset x0 is blocked by capacitor 112a.

After this time, at step 604, the AGC gain is set to a first value at a reference time t=0, as illustrated in FIG. 7A. The system response, a step in the output voltage V(t) followed by a gradual decrease, is shown in FIG. 7B. It should be noted that the use of t=0 herein as a reference time for both phases is a notational convenience; the measurements of system output in Phase One and Phase Two are not performed concurrently.

At step 606, a time average of the output voltage (y1') is measured over a time interval beginning at time T–τ (relative to the Phase Two reference time) and ending at time T. The values of T and τ throughout Phase Two should match those used in Phase One as nearly as practicable so that the system response parameters a, b, and c can be directly used to determine the DC offset, as will be described below. The measurement of y1' is performed in the same manner as described above for the measurement of y1 in Phase One (step 306), and the resulting value is illustrated in FIG. 7B.

At time T, just after the measurement of y1' is completed, calibration unit 150 signals AGC unit 130 to shift the gain setting to a second value (step 614), as shown in FIG. 7A. A time-averaged output voltage (y2') is then measured over a time interval beginning at time 2T–τ and ending at time 2T (step 616), as shown in FIG. 7B. The measurement of y2' is performed in the same manner as the measurement of y1 in Phase One (step 306).

At time 2T, just after the measurement of y2' is completed, calibration unit 150 signals AGC unit 130 to shift the gain setting to a third value (step 624), as shown in FIG. 7A. A time-averaged output voltage (y3') is then measured over a time interval beginning at time 3T–τ and ending at time 3T (step 626), as shown in FIG. 7B. The measurement of y3' is performed in the same manner as the measurement of y1 in Phase One (step 306).

At step 630, the DC offset shifts (defined as x1'−x0, x2'−x0, and x3'−x0, respectively) corresponding to the three shifts in the gain setting are computed. More specifically, because the timing (i.e., the values of T and τ) in Phase Two very nearly matches that of Phase One, equations (6)–(8) for the Phase-One time-averaged output voltages y1, y2, and y3 apply equally to the Phase-Two time-averaged output voltages y1', y2', and y3', with the unknown DC offset values x1', x2', and x3' replacing x1, x2, and x3, respectively. Using the values of the system response parameters a, b, and c obtained in Phase One, the DC offset shifts (x1'−x0, x2'−x0, x3'−x0) relative to the unknown DC offset x0 of the standby state are determined using the equations:

$$x1' - x0 = \frac{y1'}{a}; \quad (12)$$

$$x2' - x0 = \frac{[y1' + y2' - b(x1' - x0)]}{a}; \text{ and} \quad (13)$$

$$x3' - x0 = \frac{[y1' + y2' + y3' - b(x2' - x0) - c(x1' - x0)]}{a}. \quad (14)$$

These values are then used to generate lookup table values for controlling DAC 142 during receiver operation as described above. Methods for generating the lookup table values from measured DC offset shifts are known in the art, and any suitable method may be used.

The calibration process described above is illustrative, and it will be appreciated that modifications and variations are possible. For instance, while three changes in gain settings were applied during Phase Two in the exemplary embodiment, that number may be modified according to the design of a particular receiver. Preferably, a gain setting corresponding to every available combination of mixer gain and low noise amplifier gain is calibrated. Gain settings may be applied in any order. Calibration unit 150, which controls the order of applying the gain settings in Phase Two, ensures that the mapping of each gain setting to the corresponding DAC setting in the lookup table is correct.

Likewise, while the exemplary embodiment used three parameters (a, b, and c) to characterize the system response, it will be appreciated that the number of system parameters may also vary. Preferably the number of system parameters measured in Phase One corresponds to the number of gain values applied in Phase Two. It is possible to extend Phase One to include more measurements than the number of system parameters applied in Phase Two; the values of parameters to be used in Phase Two would be determined by statistical methods, e.g., least-squares fitting. In another alternative embodiment, the entire calibration procedure may be repeated and the results averaged.

In Phase One, the DAC settings reflecting the DC offsets may be applied in any order. To obtain accurate measurements of the system response parameters in the presence of noise, it is advantageous to begin with a large shift in the DAC setting, then shift the DAC setting downward in smaller increments at subsequent steps, as illustrated in FIG. 5A. However, it will be appreciated that any combination of DAC settings in any order may be applied. In some embodiments, the same DAC setting may be applied at two consecutive steps, i.e., the shift in the DAC setting at any step other than the first may be zero.

In addition, the timing described above may be modified. For instance, different durations for the time interval T between changes in the DC offset (during Phase One) and the gain setting (during Phase Two) and for the measurement time interval τ may be used, as long as the values of T and τ in Phase Two match the values in Phase One as nearly as practicable. The measurement time interval τ may begin at any time after the stepwise change occurs and may occupy any fraction of the interval T between stepwise changes, provided that the measurement interval ends before the next stepwise change occurs. It will be appreciated that making the end of the measurement interval substantially concurrent with the next stepwise change, as described above, minimizes the total time required for calibration. It will also be appreciated that delaying the start time of the measurement interval after a change in the DC offset or gain setting reduces sensitivity of the measurements to ringing effects, thereby improving the reliability of the algorithm.

Figure 8A:
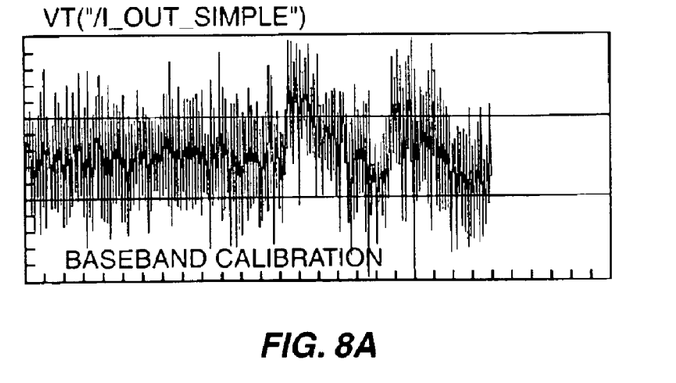
FIGS. 8A–C are graphs illustrating performance of a calibration process according to an embodiment of the present invention in the presence of a received signal.
Figure 8B:
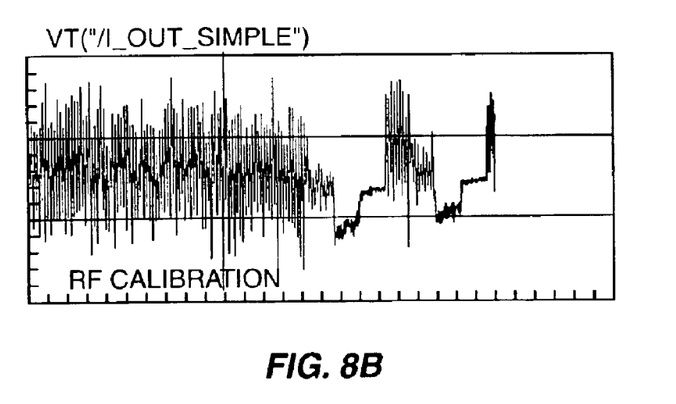
Figure 8C:
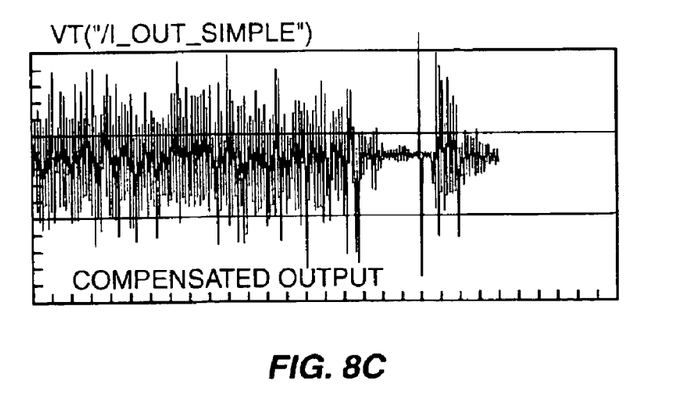

Calibration according to the present invention may be performed while a signal is present in the receiver. FIGS. 8A–C illustrate, for a simulation of receiver 100, the effect of a signal on the calibration algorithm described above. FIG. 8A illustrates the output voltage of the receiver as a function of time during Phase One. FIG. 8B illustrates the output voltage as a function of time during Phase Two. FIG. 8C illustrates the compensated output after calibration. That is, FIG. 8C shows the effect of using the calibrated lookup table to provide a DC offset cancellation current based on the gain setting. This output voltage is centered at zero, indicating that the DC offset is being properly canceled. In an alternative embodiment, results from multiple calibration cycles may also be averaged together to reduce signal effects.

It will be appreciated that the calibration algorithm of the present invention is preferably not performed while a signal that carries data of interest is being received because the changes in DC offset current and gain may cause data corruption and/or increased error rate. Therefore, the occurrence of the calibration cycle should be controlled so that calibration is performed only when signals carrying data of interest are not being received. For instance, in some applications (e.g., systems employing time-division multiplexing access (TDMA)), data is transmitted to the receiver in bursts, and calibration may be performed between data bursts. In the embodiment described above, three changes in DC offset (or gain setting) occur in each phase, the step time interval T between changes is about 4 μs, and the phases are separated by about 50 μs to allow the DC blocking capacitor to return to a steady state. The total calibration time in this embodiment is thus approximately 100 μs; other embodiments may have different total calibration times. If the time between data bursts is longer than the total calibration time, calibration may be completed between bursts. In cases where the time between data bursts is shorter than the calibration time, the present algorithm may still be used. For instance, Phase One may be performed before a data burst and Phase Two after the data burst, with calibration being stopped while the data burst is being received.

Persons of ordinary skill in the art will also recognize that the calibration algorithm of the present invention may be performed as frequently as desired. In some applications, calibration cycles may alternate with data bursts as part of regular system operation; in other applications, less frequent calibration may be appropriate. To determine lookup table values, results from multiple calibration cycles may be combined, e.g., by an average or weighted average, in order to reduce sensitivity to transient fluctuations.

While the invention has been described with respect to exemplary embodiments, one skilled in the art will recognize that numerous modifications are possible. For example, the algorithm of the present invention is not limited to receiver 100 as described herein; it may be applied in a variety of receiver architectures where a DC offset is present, such as any direct conversion, or zero-IF, receiver. The DC offset cancellation may be provided by any controllable current or voltage source, or in general by any device that generates a controllable DC level. The DC level generator may be controlled by a DAC as described above, by any other device configured to generate appropriate control signals, or by signals received directly from the gain control device. In an AC-coupled receiver, AC coupling may be provided by DC blocking capacitors, analog DC compensation loops in the baseband legs, or other techniques known in the art.

The calibration method of the present invention may be implemented using any suitable technology, such as programmable logic devices, other circuitry, and in general any combination of electronic hardware and/or software components. Further, the calibration method of the present invention may also be applied in other situations for determining the value of a constant input from a time-varying response.

Thus, although the invention has been described with respect to exemplary embodiments, it will be appreciated that the invention is intended to cover all modifications and equivalents within the scope of the following claims.

What is claimed is:

1. A method of operating a receiver having a plurality of gain settings including at least a first gain setting and a second gain setting, the method comprising:

during a first phase, determining values of a plurality of system response parameters characterizing a time-dependent system response to a unit step change in the DC offset, each system response parameter being associated with a different elapsed time;

during a second phase, making a plurality of first measurements of a system output in response to a change in the gain setting from the first gain setting to the second gain setting, wherein the first measurements are made at times corresponding to the elapsed times associated with the system response parameters; and computing the difference between a first DC offset corresponding to the first gain setting and a second DC offset corresponding to the second gain setting from the values of the plurality of system response parameters and the plurality of first measurements.

2. The method of claim 1, further comprising:

storing a value representing the difference between the first DC offset and the second DC offset in a lookup table.

3. The method of claim 2, further comprising:

using the value stored in the lookup table to generate a control signal for a controllable DC-level generator, thereby providing a DC level that cancels the DC offset.

4. The method of claim 1, wherein the first phase and the second phase are both performed during a time interval between two successive data bursts.

5. The method of claim 1, wherein the first phase is performed during a first time interval between a first data burst and a second data burst and the second phase is performed during a second time interval between the second data burst and a third data burst.

6. The method of claim 1, wherein the act of determining values of a plurality of system response parameters includes:

making a plurality of second measurements of the system output in response to a sequence of shifts in a DC offset applied to the receiver, wherein each shift in the applied DC offset has a known value; and computing a value of each of the system response parameters from the plurality of second measurements.

7. The method of claim 6, wherein the act of making a plurality of second measurements includes:

while maintaining the gain setting at the reference gain setting, changing, at regular time intervals, a known DC offset applied to the receiver, wherein each regular time interval has a duration substantially equal to a step time T; and beginning at a fixed time after each act of changing the known DC offset, measuring an average system output over a measurement interval having a duration substantially equal to a measurement time $\tau$, thereby obtaining a plurality of second measurements.

8. The method of claim 7, wherein the receiver has an AC coupling between radio-frequency components and baseband components, and wherein the step time T is shorter than a settling time of the receiver, the settling time being a time required after a shift in the DC offset for the receiver to reach a steady state in which the DC offset is blocked by the AC coupling.

9. In a direct conversion receiver having a reference gain setting associated with a reference DC offset and a plurality of non-reference gain settings, each of the non-reference gain settings being associated with a respective non-reference DC offset, a method for measuring differences between the reference DC offset and each of the non-reference DC offsets, the method comprising:

during a first phase, determining values of a plurality of system response parameters characterizing a time-dependent system response to a unit step change in the DC offset, each system response parameter being associated with a different elapsed time;

during a second phase, making a plurality of first measurements of a system output in response to a sequence of stepwise changes in the gain setting, wherein the sequence includes each of the non-reference gain settings, and wherein the first measurements are made at times corresponding to the elapsed times associated with the system response parameters; and computing the differences between the reference DC offset and each of the non-reference DC offsets using the values of the plurality of system response parameters and the plurality of first measurements.

10. The method of claim 9, wherein the act of determining values of a plurality of system response parameters includes:

changing, at regular time intervals, a known DC offset applied to the receiver, wherein each regular time interval has a duration substantially equal to a step time T;

beginning at a fixed time after each act of changing the known DC offset, measuring an average system output over a measurement interval having a duration substantially equal to a measurement time $\tau$, thereby obtaining a plurality of second measurements; and computing values of the plurality of system response parameters from the plurality of second measurements.

11. The method of claim 10, wherein the act of making a plurality of first measurements includes:

changing, at regular time intervals, the gain setting of the receiver to a different one of the non-reference gains, wherein each regular time interval has a duration substantially equal to the step time T; and beginning at the fixed time after each act of changing the gain setting, measuring an average system output over a measurement interval having a duration substantially equal to the measurement time τ, thereby obtaining the plurality of first measurements.

12. The method of claim 9, further comprising:

storing values representing the differences between the reference DC offset and each of the non-reference DC offsets in a lookup table, wherein each value is stored in association with the corresponding non-reference gain setting.

13. The method of claim 12, further comprising:

using the values stored in the lookup table to generate a control signal for a controllable DC-level generator, thereby providing a DC level that cancels the DC offset.

14. The method of claim 9, wherein the first phase and the second phase are both performed during a time interval between two successive data bursts.

15. The method of claim 9, wherein the first phase is performed during a first time interval between a first data burst and a second data burst and the second phase is performed during a second time interval between the second data burst and a third data burst.

16. The method of claim 9, wherein the receiver has an AC coupling between radio-frequency components and baseband components, and wherein the step time T is shorter than a settling time of the receiver, the settling time being a time required after a shift in the DC offset for the receiver to reach a steady state in which the DC offset is blocked by the AC coupling.

17. In a direct conversion receiver having a reference gain setting associated with a reference DC offset, a plurality of non-reference gain settings, each of the non-reference gain settings being associated with a respective non-reference DC offset, and a controllable DC level generator, a method for measuring differences between the reference DC offset and each of the non-reference DC offsets, the method comprising:

setting the controllable DC level generator to a standby setting, thereby applying a standby DC offset;

while maintaining the gain setting at the reference gain setting, operating the controllable DC level generator to change, at regular time intervals, a known DC offset applied to the receiver, wherein each regular time interval has a duration substantially equal to a step time T;

beginning at a fixed time after each act of changing the known DC offset, measuring an average system output over a measurement interval having a duration substantially equal to a measurement time τ, thereby obtaining a plurality of first measurements;

computing a value of each of a plurality of system response parameters from the plurality of first measurements;

resetting the controllable DC level generator to the standby setting, thereby reapplying the standby DC offset;

while maintaining the controllable DC level generator at the standby setting, changing, at regular time intervals, the gain setting of the receiver to a different one of the non-reference gains, wherein each regular time interval has a duration substantially equal to the step time T;

beginning at the fixed time after each act of changing the gain setting, measuring an average system output over a measurement interval having a duration substantially equal to the measurement time τ, thereby obtaining a plurality of second measurements; and computing differences between the reference DC offset and each of the non-reference DC offsets using the plurality of second measurements and the values of the plurality of system response parameters.

18. The method of claim 17, further comprising:

allowing the receiver to settle in a standby state after the act of setting the controllable DC level generator to a standby setting and before the act of operating the controllable DC level generator to apply a sequence of stepwise changes in the DC offset.

19. The method of claim 17, further comprising:

allowing the receiver to settle in a standby state after the act of resetting the controllable DC current source to the standby setting and before the act of applying a sequence of stepwise changes in the gain setting.

20. The method of claim 17, wherein a first change in the known DC offset applied to the receiver is larger than any subsequent change.

21. The method of claim 17, wherein the standby DC offset has an unknown value x0.

22. The method of claim 21, wherein the act of changing, at regular time intervals, the known DC offset applied to the receiver results in a sequence of three stepwise changes in the DC offset consisting of three shifts of known magnitude relative to the standby DC offset x0, the three shifts being defined as x1−x0, x2−x0, and x3−x0, respectively.

23. The method of claim 22, wherein the system response parameters are denoted by a, b, and c, wherein the plurality of first measurements includes three successive measurements denoted by y1, y2, and y3, respectively, and wherein determining the value of each of the plurality of system response parameters includes:

$$\text{computing } a = y1 / (x1 - x0);$$

$$\text{computing } b = [y2 - a(x2 - x1)] / (x1 - x0); \text{ and}$$

$$\text{computing } c = [y3 - a(x3 - x2) - b(x2 - x1)] / (x1 - x0).$$

24. The method of claim 23, wherein the plurality of second measurements includes three successive measurements denoted by y1', y2', y3', respectively, and determining a change in DC offset current associated with a gain setting includes:

$$\text{computing } x1' - x0 = y1' / a;$$

$$\text{computing } x2' - x0 = [y1' + y2' - b(x1' - x0)] / a; \text{ and}$$

$$\text{computing } x3' - x0 = [y1' + y2' + y3' - b(x2' - x0) - c(x1' - x0)] / a,$$

wherein x1'−x0, x2'−x0, and x3'−x0 are the changes in DC offset corresponding to a first, a second, and a third gain setting respectively.

25. The method of claim 17, wherein the sum of the fixed time and the measurement time τ is substantially equal to the step time T.

26. The method of claim 17, wherein the measurement time τ is substantially equal to half the step time T.

* * * * *